United States Patent
Inoue et al.

(10) Patent No.: US 9,959,895 B2
(45) Date of Patent: *May 1, 2018

(54) METHOD FOR MANUFACTURING MAGNETIC RECORDING MEDIUM, MAGNETIC RECORDING MEDIUM AND MAGNETIC RECORDING AND REPRODUCING APPARATUS

(71) Applicant: SHOWA DENKO K.K., Tokyo (JP)

(72) Inventors: Ken Inoue, Chiba (JP); Kenji Shimizu, Chiba (JP); Gohei Kurokawa, Chiba (JP); Haruhisa Ohashi, Chiba (JP)

(73) Assignee: SHOWA DENKO K.K., Tokyo (JP)

( * ) Notice: Subject to any disclaimer, the term of this patent is extended or adjusted under 35 U.S.C. 154(b) by 21 days.

This patent is subject to a terminal disclaimer.

(21) Appl. No.: 14/446,450

(22) Filed: Jul. 30, 2014

(65) Prior Publication Data

US 2015/0036243 A1  Feb. 5, 2015

(30) Foreign Application Priority Data

Aug. 5, 2013 (JP) .................. 2013-162332

(51) Int. Cl.
*C23C 14/34* (2006.01)
*G11B 5/851* (2006.01)
(Continued)

(52) U.S. Cl.
CPC .............. *G11B 5/851* (2013.01); *C23C 14/08* (2013.01); *G11B 5/65* (2013.01); *G11B 5/66* (2013.01); *G11B 5/8404* (2013.01)

(58) Field of Classification Search
CPC .. G11B 5/851; G11B 5/65; G11B 5/66; G11B 5/8404; C23C 14/08
See application file for complete search history.

(56) References Cited

U.S. PATENT DOCUMENTS 6,670,056 B2   12/2003  Hikosaka
7,470,474 B2   12/2008  Sakawaki et al.
(Continued)

FOREIGN PATENT DOCUMENTS

CN   101836255    9/2010
JP   H07-244831   9/1995
(Continued)

OTHER PUBLICATIONS

Translation to Tanaka (JP 2011-123976) published Jun. 2011.*

*Primary Examiner* — John J Brayton
(74) *Attorney, Agent, or Firm* — IPUSA, PLLC

(57) ABSTRACT

A method for manufacturing a magnetic recording medium is provided. An orientation control layer is deposited on a non-magnetic substrate to control an orientation of a layer located directly thereon, and a perpendicular magnetic layer whose easy axis of magnetization is mainly oriented perpendicular to the non-magnetic substrate is deposited thereon. In depositing the orientation control layer, a first granular structure layer containing Ru or a material mainly made of Ru and a first oxide having a melting point of 1000 degrees C. or lower are deposited by sputtering. In depositing the perpendicular magnetic layer, a second granular structure layer containing magnetic particles and a second oxide having a melting point of 1000 degrees C. or lower are deposited by sputtering, and the magnetic particles are grown so as to form a columnar crystal continuing in a thickness direction. The columnar crystal includes crystal grains constituting the orientation control layer.

5 Claims, 1 Drawing Sheet

(51) Int. Cl.
  *C23C 14/08*  (2006.01)
  *G11B 5/65*  (2006.01)
  *G11B 5/66*  (2006.01)
  *G11B 5/84*  (2006.01)

(56) References Cited

U.S. PATENT DOCUMENTS

| | | | |
|---|---|---|---|
| 2004/0161638 A1* | 8/2004 | Maeda | G11B 5/65 |
| | | | 428/832 |
| 2005/0186450 A1* | 8/2005 | Takenoiri | G11B 5/64 |
| | | | 428/827 |
| 2006/0014052 A1 | 1/2006 | Watanabe et al. | |
| 2006/0057431 A1* | 3/2006 | Tamai | G11B 5/65 |
| | | | 428/836.2 |
| 2008/0220157 A1 | 9/2008 | Takenoiri et al. | |
| 2010/0209740 A1 | 8/2010 | Ayama et al. | |
| 2011/0097603 A1 | 4/2011 | Onoue | |
| 2011/0111257 A1* | 5/2011 | Kurokawa | G11B 5/732 |
| | | | 428/800 |
| 2011/0151280 A1 | 6/2011 | Takahashi et al. | |

FOREIGN PATENT DOCUMENTS

| | | |
|---|---|---|
| JP | 2002-197630 | 7/2002 |
| JP | 2004-178753 | 6/2004 |
| JP | 2004-310910 | 11/2004 |
| JP | 2005-216362 | 8/2005 |
| JP | 2006-048904 | 2/2006 |
| JP | 2007-272990 | 10/2007 |
| JP | 2009-099242 | 5/2009 |
| JP | 2009-238299 | 10/2009 |
| JP | 2011123976 A * | 6/2011 |
| WO | 2010/035810 | 4/2010 |

\* cited by examiner

METHOD FOR MANUFACTURING MAGNETIC RECORDING MEDIUM, MAGNETIC RECORDING MEDIUM AND MAGNETIC RECORDING AND REPRODUCING APPARATUS

CROSS-REFERENCE TO RELATED APPLICATIONS

This application is based upon and claims the benefit of priority of the prior Japanese Patent Application No. 2013-162332 filed on Aug. 5, 2013, the entire contents of which are incorporated herein by reference.

BACKGROUND OF THE INVENTION

1. Field of the Invention

The present invention relates to a method for manufacturing a magnetic recording medium, a magnetic recording medium and a magnetic recording and reproducing apparatus.

2. Description of the Related Art

A hard disk drive (HDD) that is a type of magnetic recording and reproducing apparatus has been currently increasing its recording density at an annual rate of 50% or more, and the recording density is said to be likely to continue to increase in the future. Following this, a magnetic head and a magnetic recording medium suitable for recording density growth have been developed.

In the magnetic recording and reproducing apparatus commercially available at present, a so-called perpendicular magnetic recording medium is mounted as a magnetic recording medium in which an easy axis of magnetization within a magnetic film is oriented mainly perpendicularly thereto. The perpendicular magnetic recording medium can prevent noise from increasing because the perpendicular magnetic recording medium is less subject to a diamagnetic field in a boundary region between recording bits in increasing the recording density and a clear bit boundary is formed. Moreover, the perpendicular magnetic recording medium has an excellent heat fluctuation property because a decrease in recording bit cubic volume associated with the recording density growth can be lessened.

Furthermore, in order to respond to the demand for further recording density growth of the magnetic recording medium, using a single magnetic pole head with an excellent ability to write to a perpendicular magnetic layer has been examined. More specifically, a magnetic recording medium has been proposed that improves efficiency of entrance and exit of a magnetic flux by providing a layer made of a soft magnetic material that is called a backing layer (or a protective layer) between the perpendicular magnetic layer of a recording layer and a non-magnetic layer.

In addition, in order to improve a record and reproduce characteristic of the perpendicular recording medium and the heat fluctuation property, a method is proposed in which a plurality of magnetic layers are formed by using an orientation control layer, and a crystal grain of each of the magnetic layers are made a continuous columnar crystal, thereby enhancing a perpendicular orientation characteristic, as disclosed in Japanese Laid-Open Patent Application Publication No. 2004-310910.

Moreover, Japanese Laid-Open Patent Application Publication No. 07-244831 discloses a method of preliminarily providing a crystalline orientation promoting layer on a substrate and depositing a perpendicular magnetic anisotropy thin film through the crystalline orientation promoting layer by sputtering at a sputtering gas pressure of 10 Pa or more.

Furthermore, Japanese Laid-Open Patent Application Publication No. 2007-272990 proposes using Ru as an orientation control layer. Ru is known to include a columnar crystal that includes a centroclinal protrusion formed on a top thereof. Because of this, by causing a crystal grain such as a magnetic layer on the protruding orientation control layer made of Ru to grow, by promoting a separate structure of the grown crystal grain, and by isolating the crystal grain, an effect of making the magnetic particle grow and form into a columnar shape can be obtained.

In addition, as disclosed in Japanese Laid-Open Patent Application Publication No. 2002-197630, a magnetic recording medium is known that includes a substrate, a ruthenium-containing layer deposited in a low pressure argon atmosphere (0.6 Pa) deposited thereon, a ruthenium-containing layer deposited in a high pressure argon atmosphere (10 Pa) deposited further thereon, and a perpendicular magnetic layer deposited on the top in sequence. By depositing the Ru layer under the high sputter pressure on the Ru layer deposited under the low sputter pressure, an orientation of the Ru layer can be improved, thereby improving the orientation of the perpendicular magnetic layer growing thereon and making the magnetic particle smaller.

Also, Japanese Laid-Open Patent Application Publication No. 2009-238299 discloses a method of reducing a size of a crystal grain of a Ru layer deposited under a high gas pressure by depositing the Ru layer under the high gas pressure on a Ru layer deposited under a low gas pressure and by causing the Ru layer deposited under the high gas pressure to contain Co and oxygen. Moreover, Japanese Laid-Open Patent Application Publication No. 2009-238299 illustrates $B_2O_3$ as an oxide contained in a granular layer.

However, in order to increase the recording density of the magnetic recording medium, there were problems described below, after performing a two-step film deposition by depositing a first Ru layer deposited by sputtering under a low pressure, and then depositing a second Ru layer deposited by sputtering under a high gas pressure on the first Ru layer, when depositing an orientation control layer including a minute crystal grain, and then reducing a size of a magnetic particle having a columnar structure of a perpendicular magnetic layer deposited on the orientation control layer.

More specifically, when sputtering under the high gas pressure, a mean free path of a sputter particle becomes short; energy is reduced; and gas molecules are likely to mix in a grown crystal, which reduce crystallinity and a film density of the deposited Ru layer. Accordingly, it was difficult to deposit a Ru layer having a high hardness by sputtering under the high pressure.

In order to deposit a Ru layer having a high hardness, it is thought not to use the sputtering under the high gas pressure. However, unless the sputtering under the high gas pressure is performed, the centroclinal protrusion becomes difficult to be formed on the top of the columnar crystal constituting the orientation control layer. Accordingly, it becomes difficult to obtain an effect of making the magnetic particle of the perpendicular magnetic layer smaller by separating the crystal grain of the perpendicular magnetic layer growing on the orientation control layer.

Due to this, conventionally, when depositing the orientation control layer by using the two step film deposition, in order to form the centroclinal protrusion on the top of the columnar crystal constituting the orientation control layer, the sputtering under the high gas pressure was performed at the cost of the hardness of the Ru layer. As a result, the magnetic recording medium including the orientation control layer deposited by using the two step film deposition was insufficient in the hardness of the surface thereof, and sufficient reliability cannot be obtained because the surface of the magnetic recording medium can be easily damaged.

Furthermore, a protruding shape caused by the centroclinal protrusion of the orientation control layer is transferred to the surface of the perpendicular magnetic layer, and then to a protective layer formed on a surface of the perpendicular magnetic layer. The Ru layer deposited by the sputtering under the high gas pressure has large irregularities in its surface. Hence, the magnetic recording medium including the orientation control layer including the Ru layer deposited by the sputtering under the high gas pressure has a high degree of roughness in its surface. When the degree of roughness of the surface of the magnetic recording medium is high, a floating height of a magnetic head becomes lower than ever, which becomes an obstacle to respond to the recording density growth.

As discussed above, in the conventional technique, there is a demand for providing a method for manufacturing a magnetic recording medium that can enhance the recording density by reducing the size of the magnetic particle having the columnar structure of the perpendicular magnetic layer, can have an excellent damage resistance in the surface thereof by depositing the orientation control layer having the high degree of hardness and the low surface roughness, can obtain the higher reliability, and can adjust to the further recording density growth.

SUMMARY OF THE INVENTION

Accordingly, embodiments of the present invention may provide a method for manufacturing a magnetic recording medium that can obtain high reliability and can implement a further recording density growth.

Moreover, embodiments of the present invention may provide a magnetic recording and reproducing apparatus including a magnetic recording medium that is manufactured by the method for manufacturing the magnetic recording medium manufactured according to the embodiments of the present invention and has high reliability and a high recording density.

To solve the above problems, conditions for depositing an orientation control layer by a sputtering method have been examined. As a result, as shown below, it is found that a columnar structure of an orientation control layer can be made smaller, and the orientation control layer having low surface roughness (Ra) of 3 angstroms or less can be obtained when a surface of a magnetic recording medium is measured by an Atomic Force Microscope (AFM), by causing the orientation control layer to have a granular structure made of Ru or a material mainly composed of Ru, and by using a material containing oxide having a melting point of 1000 degrees C. or lower as the material constituting the granular structure.

More specifically, it has been found that when a granular layer having a granular structure containing Ru or the material mainly composed of Ru and the oxide having the melting point of 1000 degrees C. or lower, because the oxide having the melting point of 1000 degrees C. or lower is likely to surround Ru, a segregation structure of Ru particles can be obtained. Because of this, it is found that even when the above granular layer is deposited by the sputtering method at a low sputtering pressure of 5 Pa or lower, the segregation structure of the particles of Ru or the material mainly composed of Ru is promoted, and the crystal grains are likely to be separated from each other, by which minute crystal grains can be obtained.

Moreover, it has been found that by depositing a perpendicular magnetic layer deposited thereon into the granular structure containing an oxide having a melting point of 1000 degrees C. or lower, the surface roughness (Ra) of the magnetic recording medium can be reduced to 2 angstroms or lower. In other words, it has been found that when the granular layer made of magnetic particles and an oxide surrounding the magnetic particles and having the melting point of 1000 degrees C. or lower is deposited by the sputtering method, because the oxide having the melting point of 1000 degrees C. or lower is likely to surround the magnetic particles, the segregation structure of the magnetic particles can be obtained. Because of this, it has been found that even when the above magnetic layer having the granular structure (which may be expressed as a granular structure layer hereinafter) is deposited by the sputtering method at a low gas pressure of preferably 3 Pa or lower, the segregation structure of the magnetic particles is promoted, and the magnetic particles are likely to separate from each other, by which minute magnetic particles and the perpendicular magnetic layer having high flatness and containing the minute magnetic particles can be obtained.

According to an embodiment of the present invention, there is provided a method for manufacturing a magnetic recording medium. In the method, to begin with, an orientation control layer is deposited on a non-magnetic substrate to control an orientation of a layer located directly thereon, and then a perpendicular magnetic layer whose easy axis of magnetization is mainly oriented perpendicular to the non-magnetic substrate is deposited on the orientation control layer. In depositing the orientation control layer, a first granular structure layer containing Ru or a material mainly made of Ru and an oxide having a melting point of 1000 degrees C. or lower are deposited by sputtering. In depositing the perpendicular magnetic layer, a second granular structure layer containing magnetic particles and an oxide having a melting point of 1000 degrees C. or lower are deposited by sputtering, and the magnetic particles are grown so as to form a columnar crystal continuing in a thickness direction. The columnar crystal includes crystal grains constituting the orientation control layer.

According to another embodiment of the present invention, there is provided a magnetic recording medium. The medium includes an orientation control layer provided on a non-magnetic substrate to control an orientation of a layer located directly thereon, a perpendicular magnetic layer whose easy axis of magnetization is mainly oriented perpendicular to the non-magnetic substrate and provided on the orientation control layer, and a surface having surface roughness (Ra) of 2 angstroms or lower when measured by an atomic force microscope. The orientation control layer includes a first granular structure layer containing Ru or a material mainly made of Ru, and an oxide having a melting point of 1000 degrees C. or lower. The perpendicular magnetic layer includes a second granular layer containing magnetic particles and an oxide having a melting point of 1000 degrees C. or lower, and the magnetic particles are a columnar crystal continuing in a thickness direction. The columnar crystal includes crystal grains constituting the orientation control layer.

According to another embodiment of the present invention, there is provided a magnetic recording and reproducing apparatus. The apparatus includes the magnetic recording medium, and a magnetic head configured to record and reproduce information in and from the magnetic recording medium.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF THE PREFERRED EMBODIMENTS

A description is given below of a method for manufacturing a magnetic recording medium, a magnetic recording medium and a magnetic recording and reproducing apparatus according to embodiments of the present invention, with reference to the drawings. Here, a featured portion may be illustrated by being enlarged for convenience to make it easy to understand the embodiments of the present invention, and a dimension ratio of respective components and the like may not be the same as the actual components.

[Magnetic Recording Medium]

A description is given below of a magnetic recording medium illustrated in FIG. 1 as an example of the embodiments of the present invention.

Figure 1:
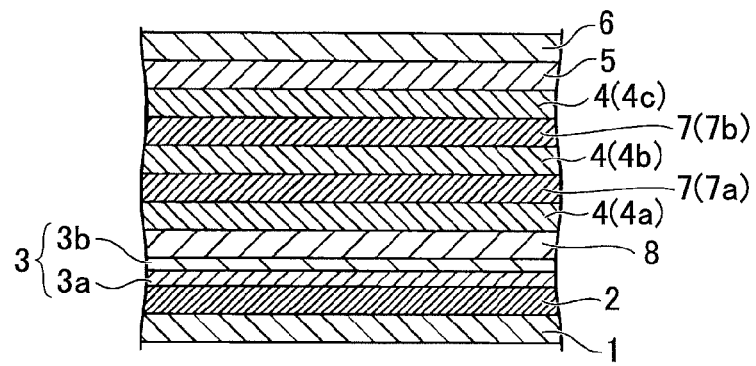
FIG. 1 is a diagram illustrating an example of a magnetic recording medium manufactured by an embodiment of the present invention.

FIG. 1 illustrates an example of the magnetic recording medium manufactured by applying the method for manufacturing the magnetic recording medium of the embodiments of the present invention. The magnetic recording medium illustrated in FIG. 1 has a structure including a soft magnetic underlayer 2, an orientation control layer 3 that controls an orientation of a layer thereon, a non-magnetic underlayer 8, a perpendicular magnetic layer 4 whose easy axis of magnetization is oriented mainly perpendicularly to a non-magnetic substrate 1, a protective layer 5, and a lubricant layer 6 that are sequentially layered on the non-magnetic substrate 1.

The magnetic recording medium of the embodiment of the present invention has a surface roughness (Ra) that is equal to or smaller than 2 angstroms when the surface thereof is measured by an atomic force microscope (AFM). The magnetic recording medium is more preferable as the surface roughness is smaller and as the surface is flatter and smoother. The magnetic recording medium of the embodiment can reduce a distance between a magnetic head and the perpendicular magnetic layer 4 and can obtain a signal/noise ratio (SNR) appropriate for high-density recording because the surface thereof has the surface roughness (Ra) that is equal to or smaller than 2 angstroms. Here, although the surface roughness of the magnetic recording medium is measured by the atomic force microscope in the embodiment of the present invention, the surface roughness may be measured after removing the lubricant layer stacked on the outermost surface of the magnetic recording medium.

<Non-Magnetic Substrate>

A metal substrate made of a metal material such as aluminum, an aluminum alloy or the like may be used as the non-magnetic substrate 1, or a nonmetallic substrate made of a nonmetallic material such as glass, ceramics, silicon, silicon carbide, carbon or the like may be used. Moreover, these metal substrates or the nonmetallic substrates including a Ni layer or a NiP alloy layer deposited on a surface thereof by, for example, a plating method and a sputtering method may be used as the non-magnetic substrate 1.

For example, amorphous glass, crystallized glass or the like can be used as the glass substrate. For example, general soda lime glass, aluminosilicate glass or the like may be used as the amorphous glass. For example, lithium based crystallized glass can be used as the crystallized glass.

For example, a sintered body composed mainly of generic aluminum oxide, aluminum nitride, silicon nitride or the like, or a fiber reinforced composition thereof can be used as the ceramic substrate.

It is preferable for the nonmetallic substrate 1 to have an average surface roughness (Ra) that is equal to or smaller than 2 nm (20 Å), preferably equal to or smaller than 1 nm in terms of suitability for recording at a high recording density performed by low-level float of a magnetic head.

Furthermore, it is preferable for the non-magnetic substrate 1 to have a small swell (Wa) at the surface that is equal to or smaller than 3 nm (more preferably equal to or smaller than 0.25 nm) in terms of suitability for the high-density recording performed by low-level floating of the magnetic head. Here, the small swell (Wa) can be measured as the surface average roughness in a measurement range of 80 μm, for example, by using a surface roughness measurement device P-12 (made by KLA-Tencor Corporation).

Furthermore, using the non-magnetic substrate 1 having an average surface roughness (Ra) of 10 nm or smaller (preferably 9.5 nm or smaller) of at least one of a chamfered part and a side surface of a chamfer part of an end surface as the non-magnetic substrate 1 is preferable to floating stability of the magnetic head.

When the non-magnetic substrate 1 contacts the soft magnetic underlayer 2 mainly composed of Co or Fe, corrosion is liable to advance due to an adsorption gas on the surface, an influence of moisture, diffusion of a substrate component or the like. By providing an adhesion layer between the non-magnetic substrate 1 and the soft magnetic underlayer 2, these causes of the corrosion can be prevented. For example, Cr, a Cr alloy, Ti, a Ti alloy or the like can be arbitrarily selected as a material of the adhesion layer. The thickness of the adhesion layer is preferably made equal to or thicker than 2 nm (30 Å).

<Soft Magnetic Underlayer>

The soft magnetic underlayer 2 is formed on the non-magnetic substrate 1. The soft magnetic underlayer 2 is provided to increase a component perpendicular to the substrate surface of magnetic flux generated from the magnetic head, and to more firmly fix a direction of magnetization of the perpendicular magnetic layer 4 in which information is recorded in the direction perpendicular to the non-magnetic substrate 1. This action becomes more noticeable when particularly using a single magnetic pole head for the perpendicular recording as a magnetic head for recording and reproduction.

For example, a soft magnetic material including Fe, Ni, Co and the like can be used as the soft magnetic underlayer 2. For example, as specific examples, a CoFe based alloy (CoFeTaZr, CoFeZrNb or the like), a FeCo based alloy (FeCo, FeCoV or the like), a FeNi based alloy (FeNi, FeNiMo, FeNiCr, FeNiCr, FeNiSi or the like), a FeAl based alloy (FeAl, FeAlSi, FeAlSiCr, FeAlSiTiRu, FeAlO or the like), a FeTa based alloy (FeTa, FeTaC, FeTaN or the like), a FeMg based alloy (FeMgO or the like), FeZr based alloy (FeZrN or the like), a FeC based alloy, a FeN based alloy, a FeSi based alloy, a FeP based alloy, a FeNb based alloy, a FeHf based alloy, a FeB based alloy and the like can be taken.

A microcrystal structure such as FeAlO, FeMgO, FeTaN, FeZrN or the like that contains 60 at % or more of Co, or a material having a granular structure in which a micro crystal grain is dispersed in a matrix, can be used as the soft magnetic underlayer 2.

In addition to the above, a Co alloy having an amorphous structure and containing 80 at % or more of Co, and at least one kind of Zr, Nb, Ta, Cr, Mo and the like, can be used as the soft magnetic underlayer 2. For example, CoZr, CoZrNb, CoZrCr, CoZrMo based alloys and the like are taken as preferable examples as the Co alloy having the amorphous structure.

A coercive force Hc of the soft magnetic underlayer 2 is preferably made 100 (Oe) or lower (preferably 20 (Oe) or lower). Here, 1 Oe equals 79 A/m. When the coercive force Hc of the soft magnetic underlayer 2 exceeds the above range, because a soft magnetic property becomes insufficient and a reproduced waveform changes from a so-called rectangle into a waveform including a distortion, exceeding the above range is not preferable.

A saturated magnetic flux density Bs of the soft magnetic underlayer 2 is preferably made 0.6 T or higher (preferably 1 T or higher). When the saturated magnetic flux density Bs of the soft magnetic underlayer 2 is lower than the above range, the reproduced waveform changes from a so-called rectangle into a waveform including a distortion, which is not preferable.

Furthermore, the product Bs·t (T·nm) of the saturated magnetic flux density Bs of the soft magnetic underlayer 2 and a film thickness t (nm) of the soft magnetic underlayer 2 is preferably made 15 (T·nm) or higher (preferably 25 (T·nm) or higher). When the product Bs·t of the soft magnetic underlayer 2 is lower than the above range, the produced waveform has a distortion and an OW (OverWrite) property (recording property) becomes worse, which is not preferable.

The soft magnetic underlayer 2 is preferably constituted of two-layered soft magnetic films, and a Ru film is preferably provided between the two-layered soft magnetic films. By adjusting the film thickness of the Ru film in a range of 0.4 to 1.0 nm, or 1.6 to 2.6 nm, the two-layered soft magnetic films can be made an AFC (AntiFerromagnetic Coupling) structure. When the soft magnetic underlayer 2 adopts such an AFC structure, so-called spike noise can be prevented.

The outermost surface of the soft magnetic underlayer 2 (the surface on the orientation control layer 2 side) is preferably formed by causing a material constituting the soft magnetic underlayer 2 to be partially or completely oxidized. More specifically, for example, it is preferable to provide the material constituting the soft magnetic underlayer 2 that is partially oxidized or the oxide of the material on the surface of the soft magnetic underlayer 2 (the surface on the orientation control layer 3 side) or the neighborhood thereof. This can prevent a magnetic fluctuation on the surface of the soft magnetic underlayer 2, can reduce the noise caused by the magnetic fluctuation, and can improve the recording and reproducing property of the magnetic recording medium.

A seed layer may be provided between the soft magnetic underlayer 2 and the orientation control layer 3. The seed layer controls a particle diameter of the orientation control layer 3. A NiW alloy can be used as a material available for the seed layer. In addition to the material, a layer having an fcc structure or the like can be used, and more specifically, a layer including Ni, Cu, Rh, Ag, Ir, Pt Au, Al can be illustrated.

<Orientation Control Layer>

The orientation control layer 3 that controls the orientation of the perpendicular magnetic layer 4 is deposited on the soft magnetic underlayer 2. As illustrated in FIG. 1, the orientation control layer 3 is preferably constituted of a low gas pressure layer 3a deposited on the soft magnetic underlayer 2 and a high gas pressure layer (granular layer) 3b deposited on the low gas pressure layer 3a in order to make the magnetic particle of the perpendicular magnetic layer 4 smaller. The low gas pressure layer 3a is to increase a nucleus generating density of the perpendicular magnetic layer 3.

The low gas pressure layer 3a is made of Ru or a material that is mainly composed of Ru. A Ru based alloy can be cited as the material constituting the low gas pressure layer 3a that is mainly composed of Ru.

In the embodiment, because the low gas pressure layer 3a is made of Ru or the material that is mainly composed of Ru, the centroclinal protrusion is formed on the top of the columnar crystal constituting the low gas pressure layer 3a. Hence, by depositing the high gas pressure layer 3b and the perpendicular magnetic layer 4 on the low gas pressure layer 3a in sequence, the crystal grains of the high gas pressure layer 3b and the perpendicular magnetic layer 4 can be grown on the centroclinal protrusion of the low gas pressure layer 3a. Accordingly, the orientation control layer 3 of the embodiment has an excellent orientation that can promote separation of the crystal grains of the perpendicular magnetic layer 4, isolate the crystal grains and make the crystal grains grow into the columnar shape.

The low gas pressure layer 3a preferably has a layer thickness in a range of 8 to 12 nm. When the layer thickness of the low gas pressure layer 3a is in the range of 8 to 12 nm, a distance between the magnetic head and the soft magnetic underlayer 2 during recording becomes small, and the recording and reproducing property can be improved without reducing the resolution of a reproducing signal.

When the layer thickness of the low gas pressure layer 3a is lower than the above range, an effect of enhancing the orientation of the perpendicular magnetic layer 4 and making magnetic particles 42 constituting the perpendicular magnetic layer 4 smaller may become insufficient, and a satisfactory S/N ratio may not be obtained. Moreover, when the layer thickness of the low gas pressure layer 3a exceeds the above range, the distance between the magnetic head and the soft magnetic underlayer 2 during the recording becomes great, which is liable to cause a magnetic coupling between the magnetic head and the soft magnetic underlayer 2 to be weakened and the recording property (OW) to be improper for the high-density recording.

The high gas pressure layer 3b has the granular structure containing Ru or the material that is mainly composed of Ru and an oxide having a melting point of 1000 degrees C. or lower. Such a high gas pressure layer 3b has been conventionally deposited by using a Ru based alloy and by setting a sputtering gas pressure at 8 Pa or higher. In contrast, in the embodiment of the present invention, even when the high gas pressure layer 3b is deposited by the sputtering method at a low pressure of 5 Pa or lower, more preferably in a range of 1 to 4 Pa, the crystal grains are separated from each other, and the magnetic particles having the columnar structure of the perpendicular magnetic layer 4 grown on the high gas pressure layer 3b can be made smaller.

$In_2O_3$, $TeO_2$, $Sb_2O_3$, $B_2O_3$ and the like are cited as examples of the oxide having the melting point of 1000 degrees C. or lower contained in the high gas pressure layer 3b, and $B_2O_3$ (Boron Oxide) is the most preferable of the cited examples because the melting point thereof is remarkably low, in particular. The oxide contained in the high gas pressure layer 3b may be a mixture of oxides of two kinds or more as long as the melting point is 1000 degrees C. or lower as a whole. For example, the mixture may include a mixture of an oxide having a melting point of 1000 degrees C. or lower such as $In_2O_3$, $TeO_2$, $Sb_2O_3$, $B_2O_3$ and an oxide having a melting point that is higher than 1000 degrees C. such as $SiO_2$, $TiO_2$, $Cr_2O_3$, $Ta_2O_5$, $Nb_2O_5$. TABLE 1 illustrates melting points of oxides available for the material of the high gas pressure layer 3b.

TABLE 1

| Material | Melting Point (° C.) |
| --- | --- |
| $In_2O_3$ | 850 |
| $TeO_2$ | 733 |
| $Sb_2O_3$ | 656 |
| $B_2O_3$ | 450 |
| $TiO_2$ | 1870 |
| $Cr_2O_3$ | 2435 |
| $SiO_2$ | 1650 |
| $Ta_2O_5$ | 1468 |
| $Nb_2O_5$ | 1520 |

Furthermore, a Ru based alloy is cited as the material that is mainly composed of Ru and constitutes the high gas pressure layer 3b.

The high gas pressure layer 3b preferably contains the oxides having the melting point of 1000 degrees C. or lower in a range of 2 to 35 volume % in total, more preferably in a range of 15 to 30 volume % in total. When the high gas pressure layer 3b contains the oxides having the melting point of 1000 degrees C. or lower in the range of 2 to 35 volume % in total, more preferably in the range of 15 to 30 volume % in total, the orientation control layer 3 has more excellent orientation.

When the oxide content having the melting point of 1000 degrees C. or lower in the high gas pressure layer 3b exceeds the above range, the oxides remain in metal particles in the high gas pressure layer 3b, and the crystallinity and the orientation of the metal particles are deteriorated. In addition to this, the crystallinity and the orientation of the perpendicular magnetic layer 4 deposited on the orientation control layer 3 are liable to be deteriorated, which is not preferable. Moreover, when the oxide content having the melting point of 1000 degrees C. or lower is lower than the above range, the effect of separating the crystal grains from each other by making the high gas pressure layer 3b contain the oxides having the melting point of 1000 degrees C. or lower is liable not to be able to be obtained sufficiently, which is not preferable.

Here, a description is given below of a relationship between the crystal grains constituting the orientation control layer 3 and the magnetic particles constituting the perpendicular magnetic layer 4 in the magnetic recording medium of the embodiment, with reference to the drawings.

Figure 2:
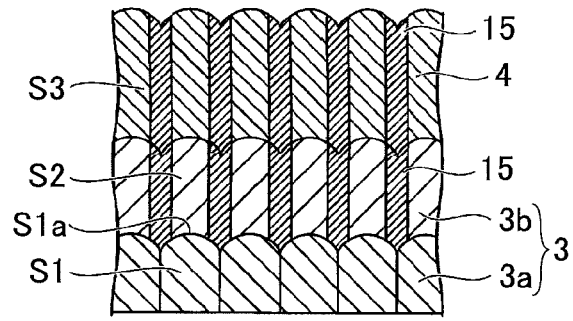
FIG. 2 is a schematic enlarged view for explaining a laminated structure of an orientation control layer and a perpendicular magnetic layer, and a cross-sectional view illustrating a state of a columnar crystal of each layer growing perpendicularly to a substrate surface.

FIG. 2 is a schematic enlarged view for explaining a laminated structure of the orientation control layer 3 and the perpendicular magnetic layer 4, and is a cross-sectional view illustrating a state of the columnar crystal of each layer growing perpendicularly to the substrate surface. Here, a depiction of components other than the low gas pressure layer 3a and the high gas pressure layer 3b constituting the orientation control layer 3 and the perpendicular magnetic layer 4 is omitted in FIG. 2.

As illustrated in FIG. 2, a concave-convex surface S1a that makes the top of the columnar crystal S1 constituting the low gas pressure layer 3a the centroclinal protrusion is formed on the low gas pressure layer 3a. Crystal grains constituting the high gas pressure layer 3b grow from the concave-convex surface S1a in a thickness direction while forming columnar crystals S2 on the concave-convex surface S1a of the low gas pressure layer 3a. Here, because the high gas pressure layer 3b has the granular structure, oxides 15 (e.g., boron oxide) are formed around the columnar crystal constituting the high gas pressure layer 3b. Furthermore, crystal grains of the perpendicular magnetic layer 4 grow in the thickness direction while forming columnar crystals S3 on the columnar crystals S2 constituting the high gas pressure layer 3b, and the oxides 15 (e.g., boron oxide) are formed around the columnar crystals S3.

In this manner, in the magnetic recording medium in the embodiment, the columnar crystals S2 of the high gas pressure layer 3b and the columnar crystals S3 of the perpendicular magnetic layer 4 grow epitaxially on the columnar crystals S1 constituting the low gas pressure layer 3a. Here, in the embodiment, the perpendicular magnetic layer 4 may be multi-layered. In this case, the crystal grains constituting each layer of the perpendicular magnetic layer repeat the epitaxial growth while becoming continuous columnar crystals from the orientation control layer 3 until reaching the perpendicular magnetic layer 4 of the top layer. Accordingly, in the embodiment, by making the crystal grains constituting the low gas pressure layer 3a smaller, and by increasing the density of the columnar crystals S1, the densities of the columnar crystals S2 of the high gas pressure layer 3b growing to form into a columnar shape in the thickness direction from the top of the columnar crystals S1 and the columnar crystals S3 of the perpendicular magnetic layer 4 are increased.

<Non-Magnetic Underlayer>

In the magnetic recording medium of the embodiment, a non-magnetic underlayer 8 is provided between the orientation control layer 3 and the perpendicular magnetic layer 4. Here, although the non-magnetic underlayer 8 is preferred to be provided between the orientation control layer 3 and the perpendicular magnetic layer 4, the non-magnetic underlayer 8 may not be provided. At an initial portion of the perpendicular magnetic layer 4 located directly on the orientation control layer 3, disarray of the crystal growth is likely to occur, which causes noise. By providing the non-magnetic underlayer 8, generation of the noise can be prevented.

The non-magnetic underlayer 8 of the embodiment is epitaxially grown as the columnar crystals continuing from the columnar crystals of the low gas pressure layer 3a and the high gas pressure layer 3b of the orientation control layer 3.

The thickness of the non-magnetic underlayer 8 is preferred to be 0.2 nm or thicker and 3 nm or thinner. When the thickness of the non-magnetic underlayer 8 is thicker than 3 nm, the decrease of the Hc and Hn is caused, which is not preferable.

The non-magnetic underlayer 8 is preferred to be made of a material containing Cr and an oxide. The Cr content is preferred to be 25 at % (atom %) or more and 50 at % or less. For example, an oxide of In, Te, Sb, B, Cr, Si, Ta, Al, Ti, Mg, Co or the like is preferably used as the oxide, among which $In_2O_3$, $TeO_2$, $Sb_2O_3$, $B_2O_3$ are particularly preferred to be used, and $B_2O_3$ can be used the most preferably. The oxide content is preferably in a range of 2 to 35 atom %, more preferably in a range of 15 to 30 atom %. The reason why the oxide content in the non-magnetic underlayer 8 is preferred to be the above range is because the oxide deposits around the non-magnetic particles in depositing the non-magnetic underlayer 8, and isolating the non-magnetic particles, reducing the size thereof and planarizing the growth surface become possible.

<Perpendicular Magnetic Layer>

The perpendicular magnetic layer 4 is deposited on the non-magnetic underlayer 8. As illustrated in FIG. 1, the perpendicular magnetic layer 4 includes three layers of a magnetic layer 4a of a lower layer, a magnetic layer 4b of a middle layer, and a magnetic layer 4c of an upper layer from a non-magnetic substrate 1 side. The magnetic recording medium of the embodiment is structured to include the magnetic layers 4a through 4c and non-magnetic layers 7a and 7b layered alternately by including the non-magnetic layer 7a of a lower layer between the magnetic layer 4a and the magnetic layer 4b, and the non-magnetic layer 7b of an upper layer between the magnetic layer 4b and the magnetic layer 4c.

Crystal grains constituting each of the magnetic layers 4a through 4c and the non-magnetic layers 7a and 7b form columnar crystals continuing in the thickness direction together with crystal grains constituting the orientation control layer 3. The perpendicular magnetic layer 4 (i.e., the magnetic layers 4a through 4c and the non-magnetic layers 7a and 7b) is epitaxially grown on the non-magnetic underlayer 8 as the columnar crystals continuing from the columnar crystals of the low gas pressure layer 3a and the high gas pressure layer 3b of the orientation control layer 3.

Although the non-magnetic layers 7a and 7b are not particularly limited, for example, Ru or a material made of a Ru alloy is cited, and for example, RuCo is cited as the Ru alloy. In particular, by setting the layer thickness of the non-magnetic layers 7a and 7b in a range of 0.6 to 1.2 nm, the magnetic layers 4a, 4b and 4c can be coupled together by AFC (AntiFerromagnetic exchange Coupling). In addition, in the embodiment of the present invention, the respective magnetic layers 4a, 4b and 4c may be magnetostatically coupled together by FC (Ferromagnetic exchange Coupling).

Figure 3:
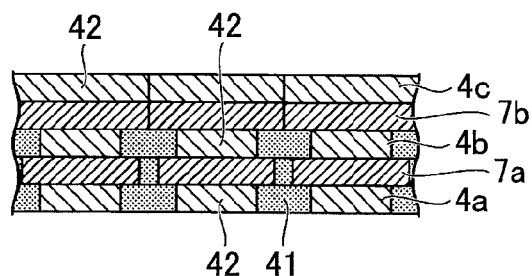
FIG. 3 is an enlarged cross-sectional view illustrating a laminated structure of a magnetic layer and a non-magnetic layer that constitute a perpendicular magnetic layer.

FIG. 3 is an enlarged cross-sectional view illustrating a laminated structure of the magnetic layers constituting the perpendicular magnetic layer and the non-magnetic layers. As illustrated in FIG. 3, the magnetic layers 4a and 4b constituting the perpendicular magnetic layer 4 (4a, 4b, 4c) are magnetic layers having a granular structure, which preferably contains magnetic particles (crystal grains having a magnetic property) 42 including Co, Cr and Pt, and oxides 41. Moreover, the magnetic layer 4c constituting the perpendicular magnetic layer 4 is a magnetic layer that does not have the granular structure (magnetic layer made of a non-granular material).

In the embodiment of the present invention, the perpendicular magnetic layer 4 is configured to include a plurality of granular structure layers (4a and 4b), and all of the plurality of granular structure layers (4a and 4b) are preferably formed into layers that includes the magnetic particles 42 and oxides 41 having a melting point of 1000 degrees C. or lower. This serves to transfer smoothness of the growth surface obtained at the orientation control layer 3 to the perpendicular magnetic layer 4 without any change and maintained thereat as it is, and to make the magnetic particles easy to separate from each other by promoting a segregated structure, by which the perpendicular magnetic layer is obtained that includes fine magnetic particles and a growth surface having higher flatness than the orientation control layer including the fine magnetic particles.

The oxides 41 are an oxide having a melting point of 1000 degrees C. or lower, and more specifically, $In_2O_3$, $TeO_2$, $Sb_2O_3$, $B_2O_3$ and the like are cited, among which $B_2O_3$ is the most preferable because its melting point is remarkably low in particular. The oxides contained in the magnetic layers 4a and 4b may be a mixture of two kinds or more of oxides as long as the melting point is 1000 degrees C. or lower as a whole, and for example, a mixture of an oxide having a melting point of 1000 degrees C. or lower such as $In_2O_3$, $TeO_2$, $Sb_2O_3$ and $B_2O_3$, and an oxide having a melting point of 1000 degrees or higher such as $SiO_2$, $TiO_2$, $Cr_2O_3$, $Ta_2O_5$, $Nb_2O_5$.

The magnetic particles 42 are preferred to be dispersed in the magnetic layers 4a and 4b. The magnetic particles 42 are preferred to form a columnar structure penetrating through the magnetic layers 4a and 4b, and further the magnetic layer 4c vertically. By having such a structure, the orientation and the crystallinity of the magnetic layers 4a, 4b and 4c become preferable, and as a result, a signal/noise ratio (S/N ratio) suitable for the high-density recording can be obtained.

The amount of the oxides 41 contained in the magnetic layers 4a and 4b is preferably in a range of 2 volume % to 35 volume %, more preferably in a range of 15 volume % to 30 volume %. The reason why the contained amount of the oxides 41 content in the magnetic layers 4a and 4b is preferred to be the above range is because the oxides 41 deposit around the magnetic particles 42 in forming the magnetic layers 4a and 4b, and isolating the non-magnetic particles, reducing the size thereof and planarizing the growth surface of the perpendicular magnetic layer 4 become possible.

On the other hand, when the contained amount of the oxides 41 exceeds the above range, the oxides 41 is liable to remain in the magnetic particles 42, thereby degrading the orientation and the crystallinity of the magnetic particles 42, and is liable to deposit above and under the magnetic particles 42, thereby preventing the columnar structure formed by the magnetic particles 42 penetrating vertically through the magnetic layers 4a through 4c from being formed, which is not preferable. Moreover, when the contained amount of the oxides 41 is smaller than the above range, separation of the magnetic particles 42 and reducing the size of the magnetic particles 42 become insufficient. As a result, noise during the recording and reproduction increases, and a signal/noise ratio (S/N ratio) suitable for the high-density recording may not be obtained, which is not preferable.

Furthermore, in the embodiment of the present invention, the contained amount of the oxides 41 contained in the magnetic layers 4a and 4b is preferably increased as located at higher positions, that is to say, the contained amount of the oxides 41 in the magnetic layer 4b is preferable greater than that in the magnetic layer 4a. By adopting such a configuration, an effect of planarization of a surface of the magnetic layer of the embodiment of the present invention can be enhanced as the layer is located at a higher level.

A Cr content in the magnetic layers 4a and 4b is preferably 4 at % or more and 19 at % or less (further preferably 6 at % or more and 17 at % or less). When the Cr content in the magnetic layers 4a and 4b is made in the above range, a magnetic anisotropic constant Ku of the magnetic particles 42 does not decrease too much, and a high magnetization is maintained. As a result, a recording and reproducing property appropriate for the high-density recording and a sufficient heat fluctuation property can be obtained.

In contrast, when the Cr content in the magnetic layers 4a and 4b exceeds the above range, the heat fluctuation property becomes worse because the magnetic anisotropic constant Ku of the magnetic particles 42 becomes low, and the recording and reproducing property becomes worse resulting from the deterioration of the crystallinity and the orientation of the magnetic particles 42, which is not preferable. Also, when the Cr content is lower than the above range, because the magnetic anisotropic constant Ku of the magnetic particles 42 becomes high, a perpendicular coercive force becomes too high, and the magnetic head cannot sufficiently write data in the magnetic recording medium when recording the data. As a result, the recording property (OW) is not suitable for the high-density recording, which is not preferable.

A Pt content in the magnetic layers 4a and 4b is preferably 8 at % or more and 20 at % or less. When the Pt content is less than 8 at %, the magnetic anisotropic constant Ku necessary for the perpendicular magnetic layer 4 to obtain the heat fluctuation property suitable for the high-density recording cannot obtained, which is not preferable. When the Pt content exceeds 20 at %, a stacking fault is generated inside the magnetic particles 42, and as a result, the magnetic anisotropic constant Ku becomes low. In addition, when the Pt content exceeds the above range, a layer having the fcc structure is formed in the magnetic particles 42, and the crystallinity and the orientation is liable to be deteriorated, which is not preferable. Accordingly, in order to obtain a heat fluctuation property and a recording and reproducing property suitable for the high-density recording, setting the Pt content in the magnetic layers 4a and 4b at the above range is preferable.

The magnetic layers 4a and 4b may contain at least one kind of an element selected from B, Ta, Mo, Cu, Nd, Sm, Tb, Ru and Re other than Co, Cr and Pt. By containing the above element, reducing a size of the magnetic particles 42 can be promoted, or the crystallinity and the orientation can be improved, which allows the recording and reproducing property and the heat fluctuation property more suitable for the high-density recording to be obtained.

The above element content other than Co, Cr and Pt in the magnetic particles 42 in total is preferably 8 at % or less. When the above element content in total exceeds 8 at %, because a phase other than an hcp phase is formed in the magnetic particles 42, the crystallinity and the orientation of the magnetic particles 42 is disordered. As a result, the recording and reproducing property and the heat fluctuation property suitable for the high-density recording cannot be obtained, which is not preferable.

For example, other than 80 (Co14Cr18Pt)-20($B_2O_3$) (Cr content 14 at %, Pt content 18 at %, remaining magnetic particles made of Co 80 volume %, and $Ba_2O_3$ 20 volume %, the same hereinafter), 75(Co8Cr14Pt4Nb)-25, compositions such as (CoCrPtMo)-($B_2O_3$) (CoCrPtW)-($B_2O_3$) (CoCrPtTaNd)-($B_2O_3$) (CoCrPtECu)-($B_2O_3$) and (CoCrPtRu)-($B_2O_3$) and the like can be cited.

The magnetic layers 4a and 4b have a granular structure containing magnetic particles and an oxide having a melting point of 1000 degrees C. or lower. Even when such magnetic layers 4a and 4b are deposited under a low sputtering pressure of 3 Pa or lower, preferably in a range of 0.5 to 2 Pa by a sputtering method, the crystal grains become separated from each other, and the magnetic particles are made smaller and its growth surface are planarized.

As illustrated in FIG. 3, the magnetic layer 4c constituting the perpendicular magnetic layer 4 contains magnetic particles (particles having a magnetic property) 42 containing Co and Cr, and does not preferably contain the oxide 41. The magnetic particles 42 in the magnetic layer 42 are preferred to epitaxially grow to form into a columnar shape from the magnetic particles 42 in the magnetic layer 4a. In this case, the magnetic particles 42 of the magnetic layers 4a through 4c are preferred to epitaxially grow to form into a columnar shape while matching on a one-to-one basis to each other in each layer. Moreover, the magnetic particles 42 of the magnetic layer 4b epitaxially grow from the magnetic particles 42 in the magnetic layer 4a, by which the magnetic particles 42 of the magnetic layer 4c are made smaller and the crystallinity and orientation is further improved.

A Cr content in the magnetic layer 4c is preferably 10 at % or more and 24 at % or less. By setting the Cr content at the above range, an output during the reproduction of data can be ensured sufficiently, and further preferable heat fluctuation property can be obtained. On the other hand, when the Cr content exceeds the above range, magnetization of the magnetic layer 4c becomes too small, which is not preferable. In addition, when the Cr content is less than the above range, separating the magnetic particles 42 and making the magnetic particles 42 smaller do not occur sufficiently, and a signal/noise ratio (S/N ratio) suitable for the high-density recording cannot be obtained due to the increase of the noise during the recording and reproduction, which is not preferable.

Moreover, when the magnetic particles 42 constituting the magnetic layer 4c is a material that contains Pt other than Co and Cr, the Pt content in the magnetic layer 4c is preferably 8 at % or more and 20 at % or less. When the Pt content is in the above range, a sufficient magnetic coercive force suitable for the high-density recording can be obtained, and a further high output can be maintained during the recording and the reproduction. As a result, the recording and reproducing property and the heat fluctuation property suitable for the high-density recording can be obtained. In contrast, the Pt content in the magnetic layer 4c exceeds the above range, a phase of the fcc structure is formed in the magnetic layer 4c, and the crystallinity and the orientation are liable to be deteriorated, which is not preferable. Furthermore, when the Pt content is less than the above range, the magnetic anisotropic constant Ku to obtain the heat fluctuation property suitable for the high-density recording cannot be obtained, which is not preferable.

The magnetic particles 42 constituting the magnetic layer 4c is a magnetic layer having a non-granular structure, and can contain at least one element selected from B, Ta, Mo, Cu, Nd, W, Nb, Sm, Tb, Ru, Re and Mn other than Co, Cr and Pt. By containing the above element, making the magnetic particles 42 smaller can be promoted, or the crystallinity and the orientation can be improved, which allows the recording and reproducing property and the heat fluctuation property more suitable for the high-density recording to be obtained.

In addition, the above element content in total contained in the magnetic particles 42 of the magnetic layer 4c other than Co, Cr and Pt is preferably 16 at % or less. When the total above element content exceeds 16 at %, because a phase other than the hcp phase is formed in the magnetic particles 42, the crystallinity and the orientation of the magnetic particles 42 are disordered. As a result, the recording and reproducing property and the heat fluctuation property suitable for the high-density recording cannot be obtained, which is not preferable.

In particular, a CoCrPt based material and a CoCrPtB based material can be cited as a material appropriate for the magnetic layer 4c. As to the CoCrPtB based material, a Cr and B content in total is preferably 18 at % or more and 28 at % or less.

For example, as to the CoCrPt based material, Co14-24Cr8-22Pt (Cr content 14-24 at %, Pt content 8-22 at %, the rest Co), and as to the CoCrPtB based material, Co10-24Cr9-22Pt0-16B (Cr content 10-24 at %, Pt content 8-22 at %, B content 0-16 at %, the rest Co) are preferable as the material suitable for the magnetic layer 4c.

A CoCrPtBNd based material, a CoCrPtTaNd based material, a CoCrPtNb based material, a CoCrPtBW based material, a CoCrPtMo based material, a CoCrPtCuRu based material, a CoCrPtRe based material and the like are cited as other composition based material suitable for the magnetic layer 4c, other than Co10-24Cr8-22Pt1-5Ta (Cr content 10-24 at %, Pt content 8-22 at %, Ta content 1-5 at %, the rest Co) as to the CoCrPtTa based material, and Co10-24Cr8-22Pt1-5Ta1-10B (Cr content 10-24 at %, Pt content 8-22 at %, Ta content 1-5 at %, B content 0-10 at %, the rest Co) as to a CoCrPtTaB based material.

<Protective Layer>

A protective layer 5 is formed on the perpendicular magnetic layer 4. The protective layer 5 is to prevent the perpendicular magnetic layer 4 from eroding and a medium surface from being damaged when the magnetic head contacts the magnetic recording medium. As to the protective layer 5, a conventionally known material and a known film deposition method can be used, and for example, a material containing hard amorphous carbon, $SiO_2$, $ZrO_2$ can be used. The thickness of the protective layer 5 is preferably 1 to 10 nm in terms of the high recording density because a distance between the magnetic head and the magnetic recording medium can be made short.

<Lubricant Layer>

A lubricant layer 6 is formed on the protective layer 6. A lubricant such as Perfluorinated polyether, fluorinated alcohol, fluorinated carboxylic acid or the like is preferably used as the lubricant layer 6.

[Magnetic Recording and Reproducing Apparatus]

Figure 4:
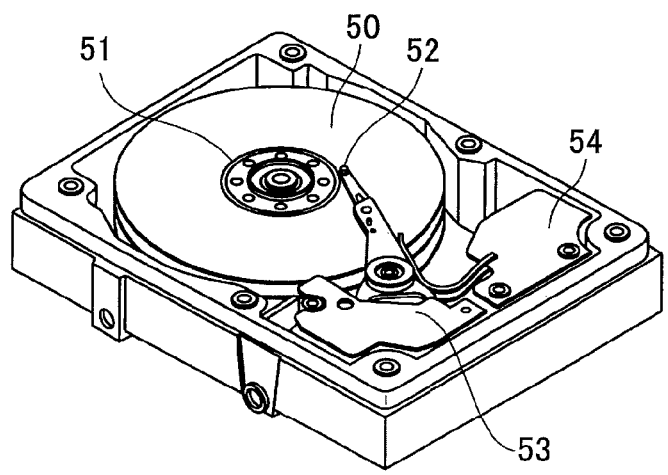
FIG. 4 is a diagram illustrating an example of a magnetic recording and reproducing apparatus according to an embodiment of the present invention.

FIG. 4 illustrates an example of a magnetic recording and reproducing apparatus to which an embodiment of the present invention is applied.

This magnetic recording and reproducing apparatus includes a magnetic recording medium 50 manufactured by the above-mentioned manufacturing method, a medium drive part 51 that drives the magnetic recording medium 50 to rotate, a magnetic head 52 that performs recording and reproduction of information in and from the magnetic recording medium 50, a magnetic drive part 53 that moves the magnetic head 52 relative to the magnetic recording medium 50, and a recording and reproducing signal processing system 54.

The recording and reproducing signal processing system 54 can process data input from the outside and send a recording signal to the magnetic head 52, and can process a reproducing signal from the magnetic head 52 and send the data to the outside. A magnetic head including a GMR (Giant MagnetoResistive) element utilizing a giant magnetoresistive (GMR) effect as a reproducing element and more suitable for the high recording density can be used as the magnetic head 52.

Because the magnetic recording and reproducing apparatus illustrated in FIG. 4 includes the magnetic recording medium 50 illustrated in FIG. 1 and manufactured by the method for manufacturing the magnetic recording medium of the embodiment of the present invention and the magnetic head 52 records and reproduces information in and from the magnetic recording medium 50, the apparatus is excellent in terms of including the high-reliability magnetic recording medium 50 capable of implementing the further high recording density.

[Working Examples]

Hereinafter, a description is given of working examples to further clarify an effect of an embodiment of the present invention. Here, the present invention is not limited to the following working examples, but can be practiced by arbitrarily adding a modification without departing from the scope of the invention.

<Working Example 1>

A magnetic recording medium according to a working example 1 was produced by a manufacturing method illustrated below.

To begin with, a glass substrate (manufactured by Konica Minolta, Inc., outer shape 2.5 inches) that had already been cleaned was carried into a film deposition chamber of a DC magnetron sputtering apparatus (manufactured by Anelva Corporation, C-3040), and the film deposition chamber was evacuated until reaching a degree of vacuum of $1 \times 10^{-5}$ Pa.

After that, an adhesive layer having 10 nm in layer thickness was deposited on the glass substrate by a sputtering method (gas pressure 0.8 Pa, Ar is used as a gas) by using a Cr target.

Next, a soft magnetic layer having 25 nm in layer thickness was deposited on the adhesive layer by using a target of Co-20Fe-5Zr-5Ta (Fe content 20 at %, Zr content 5 at %, Ta content 5 at %, the rest Co) at a substrate temperature of 100 degrees C. or lower by the sputtering method (gas pressure 0.8 Pa). Then, a Ru layer having 0.7 nm in layer thickness was deposited on the soft magnetic layer, and further a soft magnetic layer having 25 nm in layer thickness and made of Co-20Fe-5Zr-5Ta was deposited thereon and was made a soft magnetic underlayer.

Subsequently, a film having 10 nm in layer thickness and made of Ni5W was deposited on the soft magnetic underlayer as a seed layer by the sputtering method (gas pressure 0.8 Pa, Ar was used as a gas).

Next, a low gas pressure film and a high gas pressure film were formed on the seed layer as an orientation control layer.

First, Ru having 10 nm in thickness was deposited on the seed layer as the low gas pressure layer by the sputtering method (gas pressure 0.8 Pa, Ar was used as a gas).

Next, Ru-17($Ba_2O_3$) (Ru having a granular structure and containing 17 volume % of $B_2O_3$) was deposited on the low gas pressure layer as the high gas pressure layer having 10 nm in thickness by the sputtering method (gas pressure 0.8 Pa, Ar was used as a gas).

After that, a perpendicular magnetic layer was formed on the orientation control layer.

To begin with, (Co7Cr22Pt)-20($B_2O_3$) (magnetic layer having the granular structure containing Cr content 7 at %, Pt content 22 at %, the remaining magnetic particles of 80 volume % of Co and 20 volume % of $B_2O_3$) having 9 nm in layer thickness was deposited by the sputtering method (gas pressure 1.5 Pa, Ar was used as a gas).

Next, a non-magnetic layer having 0.3 nm in layer thickness and made of RuCo was deposited by the sputtering method (gas pressure 0.8 Pa, Ar was used as a gas).

Subsequently, (Co10Cr13Pt10Ru)-23($B_2O_3$) (magnetic layer having the granular structure containing Cr content 10 at %, Pt content 13 at %, Ru content 10 at %, the remaining magnetic particles 67 volume % of Co and 23 volume % of $B_2O_3$) having 9 nm in layer thickness was deposited by the sputtering method (gas pressure 1.6 Pa, Ar was used as a gas).

Next, Co15Cr16Pt6Ru (magnetic layer having a non-granular structure containing Cr content 15 at %, Pt content 16 at %, Ru content 6 at %, and the rest Co) having 7 nm in layer thickness was deposited by the sputtering method (gas pressure 0.6 Pa, Ar was used as a gas).

Subsequently, a protective layer having 3.0 nm in layer thickness and made of amorphous carbon was deposited by an ion beam method. Next, a lubricant layer having 2 nm in layer thickness and made of perfluorinated polyether was deposited by a dipping method, and a magnetic recording medium of the working example 1 was produced.

With respect to the magnetic recording medium of the working example 1 produced under such conditions, a crystal size of the magnetic layer having the granular structure and located at the top as a top layer was measured. More specifically, regarding the magnetic recording medium of the working example 1, after the magnetic layer having the granular structure made of (Co10Cr13Pt10Ru)-23 ($B_2O_3$) was deposited, the substrate was taken out of the sputtering apparatus, and an average crystal size of the crystal in which the middle-level magnetic layer having the granular structure was measured by cross-section observation using TEM.

Moreover, with respect to the magnetic recording medium of the working example 1, an SNR (signal/nose ratio (S/N ratio)) was evaluated as a recording and reproducing property by using Read Write Analyzer RWA-1632 and Spin Stand S1701MP manufactured by Guzik Technical Enterprises in the United States.

Here, a single-pole magnetic pole was used on a writing side and a head using a TMR (Tunnel Magneto-Resistance) element was used on a reading side in the magnetic head. The signal/noise ratio (S/N ratio) was measured by setting a recording density at 750 kFCI. With respect to the recording property (OW), while a signal of 750 kFCI was written at first, and then a signal of 100 kFCI was overwritten, high frequency components were extracted by a frequency filter and a data writing capacity was evaluated based on the residual ratio thereof.

Furthermore, regarding the magnetic recording medium, a surface roughness was measured by an atomic force microscope (AFM).

In addition, with respect of the magnetic recording medium of the working example 1, damage (scratch) resistance of the magnetic recording medium was evaluated. More specifically, a SAF tester manufactured by Kubota Comps Corp. and an Optical Surface Analyzer (OSA) made by KLA Tencor was used, and the magnetic head was continued to be loaded by the SAF tester for 2000 seconds under measurement conditions of 5000 rpm of a disk rotational speed, 100 Torr of an atmosphere, and room temperature. After that, the number of scratches was counted by using the OSA. TABLE 2 shows the above results.

<Working Examples 2 through 6, Comparative Examples 1 through 3>

Magnetic recording media were produced similarly to the working example 1, and evaluations of the magnetic recording media were performed. Here, granular structure layers were made having a composition as shown by TABLE 2. TABLE 2 also shows evaluation results of the magnetic recording media of the working examples 2 through 6.

TABLE 2

|  | Granular Structure Layer (Stacking Sequence) | Gas Pressure (Pa) | Particle Size of Magnetic Particle (nm) | SNR (dB) | Surface Roughness (Å) | Scratch Evaluation (Number of Scratches) |
|---|---|---|---|---|---|---|
| Working Example 1 | Ru—17($B_2O_3$)<br>(Co7Cr22Pt)—20($B_2O_3$)<br>(Co10Cr8Pt3Ru)—21($B_2O_3$)<br>(Co10Cr13Pt10Ru)—23($B_2O_3$) | 3<br>1.5<br>1.5<br>1.5 | 6.9 | 19.5 | 1.81 | 30 |
| Comparative Example 1 | Ru—17($B_2O_3$)<br>(Co7Cr22Pt)—20($TiO_2$)<br>(Co10Cr8Pt3Ru)—21($TiO_2$)<br>(Co10Cr13Pt10Ru)—23($SiO_2$) | 3<br>1.5<br>1.5<br>1.5 | 8.1 | 18.1 | 2.85 | 70 |
| Comparative Example 2 | Ru<br>(Co7Cr22Pt)—20($TiO_2$)<br>(Co10Cr8Pt3Ru)—21($TiO_2$)<br>(Co10Cr13Pt10Ru)—23($SiO_2$) | 8<br>1.5<br>1.5<br>1.5 | 9.2 | 18.0 | 3.15 | 150 |
| Comparative Example 3 | Ru<br>(Co7Cr22Pt)—20($B_2O_3$)<br>(Co10Cr8Pt3Ru)—21($B_2O_3$)<br>(Co10Cr13Pt10Ru)—23($B_2O_3$) | 8<br>1.5<br>1.5<br>1.5 | 9.1 | 19.3 | 2.90 | 130 |
| Working Example 2 | Ru—17($B_2O_3$)<br>(Co7Cr22Pt)—20($B_2O_3$)<br>(Co10Cr8Pt3Ru)—21($TiO_2$)<br>(Co10Cr13Pt10Ru)—23($SiO_2$) | 3<br>1.5<br>1.5<br>1.5 | 7.5 | 18.3 | 2.50 | 60 |
| Working Example 3 | Ru—17($B_2O_3$)<br>(Co7Cr22Pt)—20($B_2O_3$)<br>(Co10Cr8Pt3Ru)—21($B_2O_3$)<br>(Co10Cr13Pt10Ru)—23($SiO_2$) | 3<br>1.5<br>1.5<br>1.5 | 7.3 | 18.6 | 2.25 | 50 |

TABLE 2-continued

| Granular Structure Layer (Stacking Sequence) | Gas Pressure (Pa) | Particle Size of Magnetic Particle (nm) | SNR (dB) | Surface Roughness (Å) | Scratch Evaluation (Number of Scratches) |
|---|---|---|---|---|---|
| Working Example 4 | Ru—17($B_2O_3$) | 3 | 7.3 | 18.6 | 1.83 | 30 |
| | (Co7Cr22Pt)—21($B_2O_3$) | 1.5 | | | | |
| | (Co10Cr8Pt3Ru)—21($B_2O_3$) | 1.5 | | | | |
| | (Co10Cr13Pt10Ru)—21($B_2O_3$) | 1.5 | | | | |
| Working Example 5 | Ru—17($B_2O_3$) | 3 | 7.8 | 18.4 | 1.94 | 40 |
| | (Co7Cr22Pt)—20($In_2O_3$) | 1.5 | | | | |
| | (Co10Cr8Pt3Ru)—21($In_2O_3$) | 1.5 | | | | |
| | (Co10Cr13Pt10Ru)—23($In_2O_3$) | 1.5 | | | | |
| Working Example 6 | Ru—17($B_2O_3$) | 3 | 7.1 | 18.4 | 1.91 | 40 |
| | (Co7Cr22Pt)—20($B_2O_3$) | 3 | | | | |
| | (Co10Cr8Pt3Ru)—21($B_2O_3$) | 3 | | | | |
| | (Co10Cr13Pt10Ru)—23($B_2O_3$) | 3 | | | | |

As described above, a method for manufacturing a magnetic recording medium of the embodiments of the present invention can reduce a particle size of magnetic particles having a columnar structure of an orientation layer and perpendicular magnetic layer grown on the orientation control layer, and can obtain a magnetic recording medium having a signal/noise ratio (SNR) suitable for high-density recording.

Moreover, the method for manufacturing the magnetic recording medium of the embodiments of the present invention can form a granular layer at a low sputtering pressure and can obtain the orientation control layer and the perpendicular magnetic layer having a high degree of hardness. Hence, according to the method for manufacturing the magnetic recording medium of the embodiment of the present invention, a magnetic recording medium having an excellent damage resistance of a surface and high reliability can be manufactured.

Furthermore, in the method for manufacturing the magnetic recording medium of the embodiments of the present invention, by forming the granular layer at the low pressure, the orientation control layer and the perpendicular magnetic layer having reduced roughness can be obtained. Accordingly, the magnetic recording medium having a smooth surface whose surface roughness (Ra) is 2 angstroms or less when measured by an atomic force microscope can be manufactured.

Accordingly, a magnetic recording and reproducing apparatus including the magnetic recording medium manufactured by the method for manufacturing the magnetic recording medium and a magnetic head that records and reproduces information in and from the magnetic recording medium has excellent reliability that can implement further high recording density.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of depositing the film have been described in detail, it should be understood that the various changes, substitutions, and alterations could be made hereto without departing from the spirit and scope of the invention.

What is claimed is:

1. A method for manufacturing a magnetic recording medium, comprising steps of:
    depositing an orientation control layer on a non-magnetic substrate to control an orientation of a layer located directly thereon; and
    depositing a perpendicular magnetic layer whose easy axis of magnetization is mainly oriented perpendicular to the non-magnetic substrate on the orientation control layer,
    wherein the step of depositing the orientation control layer includes a step of depositing a first granular structure layer containing Ru or a material mainly made of Ru, and a first oxide having a melting point of 1000 degrees C. or lower by a sputtering method, the first oxide being at least one selected from of the group consisting of $In_2O_3$, $TeO_2$, $Sb_2O_3$ and $B_2O_3$, and
    wherein the step of depositing the perpendicular magnetic layer includes a step of depositing a second granular structure layer containing magnetic particles and a second oxide having a melting point of 1000 degrees C. or lower by a sputtering method, and the magnetic particles are grown so as to form a columnar crystal continuing in a thickness direction, the columnar crystal including crystal grains constituting the orientation control layer, the second oxide being at least one selected from of the group consisting of $In_2O_3$, $TeO_2$ and $Sb_2O_3$.

2. The method as claimed in claim 1, wherein the perpendicular magnetic layer includes a plurality of the second granular structure layers, and each of the plurality of the second granular structure layers includes the magnetic particles and the second oxide having the melting point of 1000 degrees C. or lower.

3. The method as claimed in claim 1, wherein the perpendicular magnetic layer includes a plurality of the second granular structure layers in the thickness direction.

4. The method as claimed in claim 1, wherein the first granular layer containing Ru or a material mainly made of Ru, and the first oxide having the melting point of 1000 degrees C. or lower, is deposited at a sputtering gas pressure of 5 Pa or lower.

5. The method as claimed in claim 1, wherein the second granular structure layer containing the magnetic particles and the oxide having the melting point of 1000 degrees C. or lower is deposited at a sputtering pressure of 3 Pa or lower.

* * * * *